United States Patent
Yamazaki et al.

(10) Patent No.: US 10,709,049 B2
(45) Date of Patent: Jul. 7, 2020

(54) COMPONENT MOUNTING MACHINE AND COMPONENT MOUNTING LINE

(71) Applicant: FUJI CORPORATION, Chiryu-shi (JP)

(72) Inventors: Atsushi Yamazaki, Nishio (JP); Mitsutoshi Ikeda, Nagoya (JP)

(73) Assignee: FUJI CORPORATION, Chiryu-shi (JP)

( * ) Notice: Subject to any disclaimer, the term of this patent is extended or adjusted under 35 U.S.C. 154(b) by 282 days.

(21) Appl. No.: 15/742,280

(22) PCT Filed: Jul. 8, 2015

(86) PCT No.: PCT/JP2015/069650
§ 371 (c)(1),
(2) Date: Jan. 5, 2018

(87) PCT Pub. No.: WO2017/006461
PCT Pub. Date: Jan. 12, 2017

(65) Prior Publication Data
US 2018/0199478 A1    Jul. 12, 2018

(51) Int. Cl.
*H05K 13/04*  (2006.01)
*H05K 13/00*  (2006.01)
(Continued)

(52) U.S. Cl.
CPC ......... *H05K 13/0417* (2013.01); *H05K 13/02* (2013.01); *H05K 13/08* (2013.01);
(Continued)

(58) Field of Classification Search
CPC .... H05K 13/02; H05K 13/04; H05K 13/0408; H05K 13/0409; H05K 13/0417;
(Continued)

(56) References Cited

U.S. PATENT DOCUMENTS 5,930,140 A * 7/1999 Asai .................. H05K 13/02
700/121
9,811,078 B2  11/2017 Sagara et al.
(Continued)

FOREIGN PATENT DOCUMENTS

JP    2003-298294 A   10/2003
JP    2011-35067 A    2/2011
(Continued)

OTHER PUBLICATIONS

International Search Report dated Oct. 13, 2015, in PCT/JP2015/069650 filed Jul. 8, 2015.
(Continued)

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

A component mounting machine includes multiple component supply devices which respectively include multiple component supply units and are exchangeably equipped; a component transfer device in which a reference height as a reference of a lifting and lowering operation of a mounting nozzle is set; a height memory section which memorizes a height unique value that is unique for each component supply device and that is a height unique value based on unit heights of each component supply unit when the component supply device is equipped; and a height correction control section which corrects a lowering operation stroke amount of the mounting nozzle based on the height unique value of the equipped component supply device. Accordingly, an error in a height direction can be comprehensively absorbed and the component can be stably picked up by controlling a component pick-up operation of the mounting nozzle based on the height unique value.

6 Claims, 4 Drawing Sheets

(51) Int. Cl.
*H05K 13/02* (2006.01)
*H05K 13/08* (2006.01)

(52) U.S. Cl.
CPC .......... *H05K 13/081* (2018.08); *H05K 13/086* (2018.08); *Y10T 29/53174* (2015.01); *Y10T 29/53191* (2015.01)

(58) Field of Classification Search
CPC .......... H05K 13/0419; H05K 13/0452; H05K 13/0495; H05K 13/08; H05K 13/081; H05K 13/0812; H05K 13/086; H05K 13/087; H05K 13/0882; Y10T 29/4913; Y10T 29/49131; Y10T 29/53174; Y10T 29/53178; Y10T 29/53187; Y10T 29/53191
See application file for complete search history.

(56) References Cited

U.S. PATENT DOCUMENTS

2005/0286928 A1* 12/2005 Wada .................. H05K 13/087 399/107
2012/0317802 A1* 12/2012 Yamamoto ......... H05K 13/0417 29/832

FOREIGN PATENT DOCUMENTS

| JP | 2013-4895 A | 1/2013 |
| JP | 2015-28970 A | 2/2015 |
| WO | WO 2014/207807 A1 | 12/2014 |

OTHER PUBLICATIONS

Extended European Search Report dated Jun. 26, 2018 in European Patent Application No. 15897723.1, 9 pages.

* cited by examiner

COMPONENT MOUNTING MACHINE AND COMPONENT MOUNTING LINE

TECHNICAL FIELD

The present application relates to a component mounting machine in which multiple component supply devices are exchangeably equipped, and a component mounting line including multiple component mounting machines.

BACKGROUND ART

As facilities for producing a board on which a large number of components are mounted, there are a solder printing machine, a component mounting machine, a reflow machine, a board inspection machine, and the like. It is common to link the facilities in a row to constitute a board production line. Furthermore, there are cases where multiple component mounting machines are arranged in a row to constitute a component mounting line. The component mounting machine includes a board conveyance device, a component supply device, a component transfer device, and a control device. As the component supply device, there is a feeder device of a system for feeding out a carrier tape holding a component, a tray-type device for placing and supplying a component on a tray, a wafer device using a wafer pallet holding a wafer component, or the like. In many cases, this kind of the component supply device is exchangeably equipped on a frame. One technical example relating to the component supply device is disclosed in PTL 1.

The component mounting machine of PTL 1 includes means for measuring a height position of an upper face of a push-up pot in a state where a wafer component supply device including a wafer pallet and the push-up pot is set, and the push-up pot is lifted up to a sheet suction position, and means for moving a lowered position of a suction nozzle according to a measured height position. According to the configuration, even if the height position of the upper face of the push-up pot is changed by replacing the wafer component supply device, an interval between the lowered position of the suction nozzle and the push-up pot can be automatically corrected and a wafer component can be stably sucked.

CITATION LIST

Patent Literature

PTL 1: JP-A-2013-4895

SUMMARY

Technical Problem

In the technique disclosed in PTL 1, it is preferable that the variation in a height of a component supply position caused by individual differences of the component supply devices can be absorbed. However, in a case where the component supply device is constituted by multiple feeder-type component supply units, heights of multiple component supply positions vary due to influence of not only the individual differences of the component supply devices but also the individual differences between the units, an error in an attachment height of each unit, or the like. Therefore, in the component supply device having the multiple component supply positions, it is difficult to control the height of the component supply position as compared to the technique disclosed in PTL 1. Particularly, in recent years, miniaturization of the component has been advanced and when considering minimization of the component in the future, a technique capable of absorbing variation in the height of the component supply position with high accuracy is required.

In addition, in the technique disclosed in PTL 1, since the height position of the upper face of the push-up pot is measured every time the wafer component supply device is replaced (every time the wafer component supply device is exchanged and equipped), it takes time and labor to perform setup changing work. On the other hand, the feeder-type component supply unit does not include a mechanism for vertically moving the height of the component supply position such as the push-up pot. Therefore, in the component supply device constituted by the multiple feeder-type component supply units, if the height of the component supply position is measured and memorized once, it is unnecessary to perform the measurement every time the component supply device is equipped.

The disclosure is made in view of the problem of the background art and an object of the disclosure is to provide a component mounting machine and a component mounting line capable of comprehensively absorbing not only individual differences of component supply devices but also individual differences and an error in an attachment height between component supply units, or the like, and stably picking up a component, in a configuration in which the component supply device including a plurality of the component supply units is exchangeably equipped.

Solution to Problem

A component mounting machine of the disclosure to solve the above-described problem includes a frame; a plurality of component supply devices which respectively include a plurality of component supply units for supplying components at component supply positions and are exchangeably equipped on the frame; a component transfer device which includes a mounting nozzle performing a lifting and lowering operation and picking up a component from the component supply unit to mount the component on a board, which is equipped on the frame, and for which a reference height as a reference of the lifting and lowering operation of the mounting nozzle is set; a height memory section which memorizes a height unique value that is unique for each component supply device and that is commonly set for each component supply unit based on the unit height of each component supply unit, wherein a height of the component supply position of each component supply unit when the component supply device is equipped is represented as a relative unit height to the reference height; and a height correction control section which corrects a lowering operation stroke amount when the mounting nozzle picks up the component from each component supply unit based on the height unique value of the equipped component supply device.

Advantageous Effects

In the component mounting machine of the disclosure, the height memory section memorizes the height unique value which represents the height of the component supply position of each component supply unit when the component supply device is equipped, and is unique for each component supply device. The height correction control section corrects the lowering operation stroke amount when the mounting nozzle picks up a component from each component supply unit based on the memorized height unique value. Here, the height unique value is a unique value for each component supply device so that individual differences of the component supply devices which are exchanged and equipped can be absorbed, and the height unique value is also a representative value that can suppress influence of the individual differences and an error in attachment height of the multiple component supply units, or the like. Therefore, an error in the height direction can be comprehensively absorbed and the component can be stably picked up by controlling a component pick-up operation based on the height unique value.

DESCRIPTION OF EMBODIMENTS (1. Configuration of Component Mounting Machine 1 of Embodiment)

Figure 1:
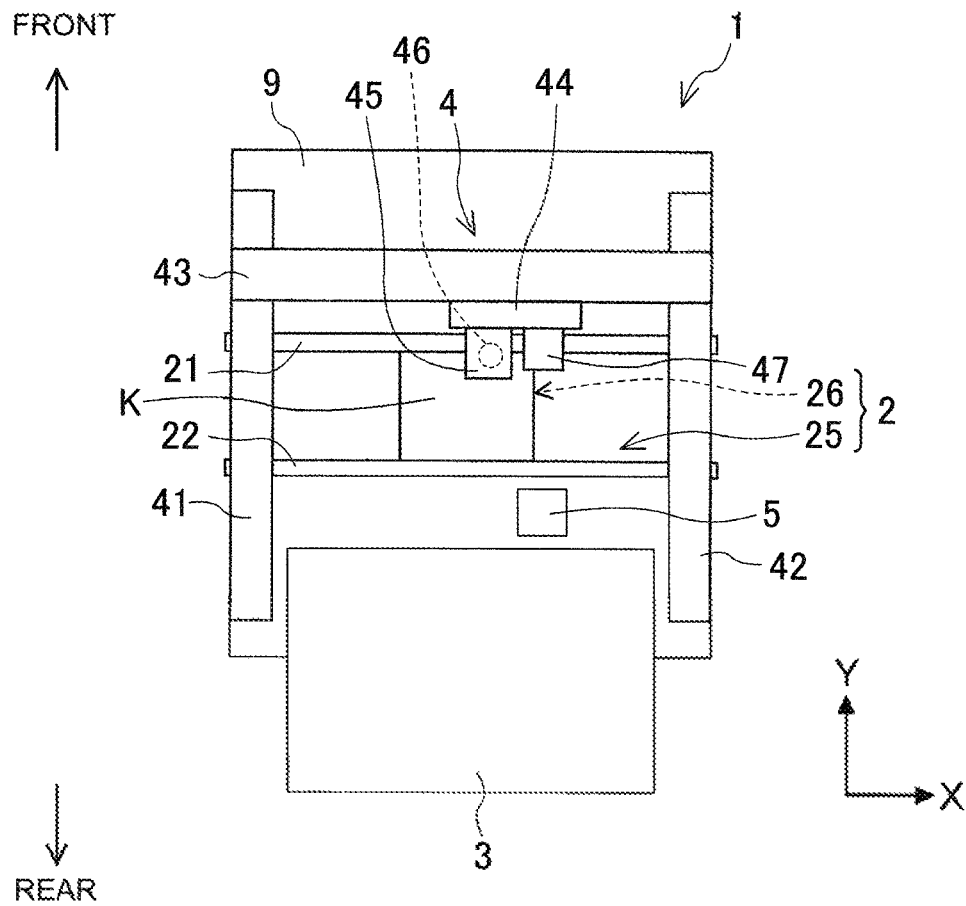
FIG. 1 is a plan view illustrating a configuration of a component mounting machine of an embodiment.
Figure 2:
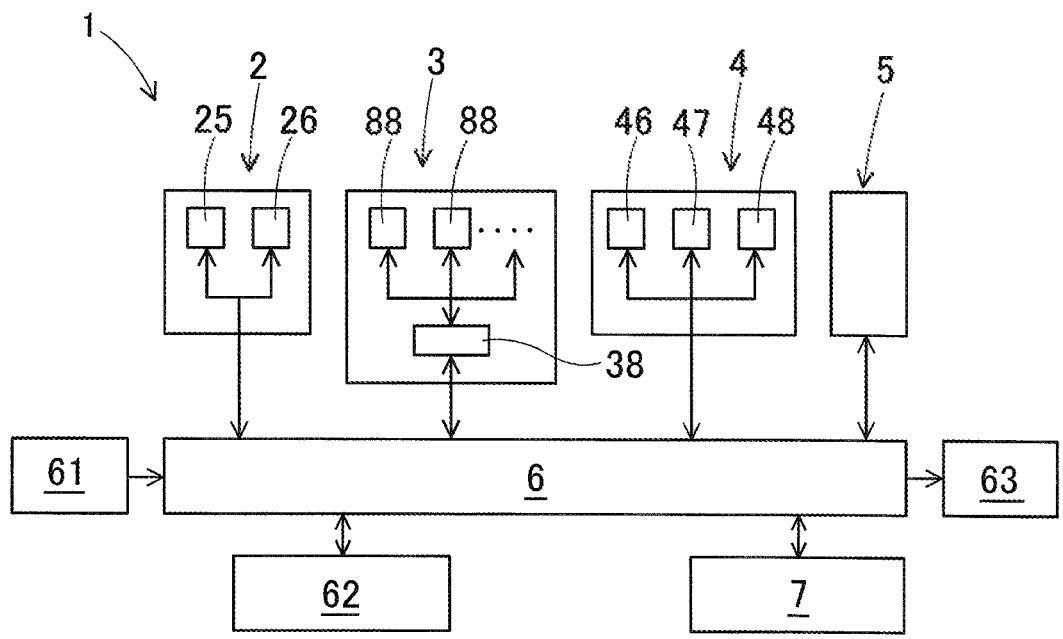
FIG. 2 is a block diagram illustrating a control configuration of the component mounting machine of the embodiment.

A component mounting machine 1 of an embodiment of the disclosure will be described with reference to FIGS. 1 to 6. FIG. 1 is a plan view illustrating a configuration of the component mounting machine 1 of the embodiment. A direction from a left side to a right side on a paper surface of FIG. 1 is referred to as an X-axis direction in which a board K is carried in and out, and a direction from a rear side on a lower side of the paper surface to a front side of an upper side of the paper surface is referred to as a Y-axis direction. The component mounting machine 1 is configured by assembling a board conveyance device 2, a component supply device 3, a component transfer device 4, a component camera 5, a control device 6 (see FIG. 2), and the like to a frame 9. FIG. 2 is a block diagram illustrating a control configuration of the component mounting machine 1 of the embodiment. The board conveyance device 2, the component supply device 3, the component transfer device 4, and the component camera 5 are controlled by the control device 6, and each performs a predetermined work.

The board conveyance device 2 carries in the board K at a mounting execution position, positions the board K, and carries out the board K. The board conveyance device 2 is configured of a conveyance unit 25 and a backup unit 26. The conveyance unit 25 is configured of a pair of guide rails 21 and 22, a pair of conveyor belts, and the like. The pair of guide rails 21 and 22 extend in a conveyance direction (X-axis direction) across a center of an upper face of the frame 9 and are assembled to the frame 9 in parallel to each other. A pair of endless annular conveyor belts (not illustrated) is juxtaposed on an inside of the pair of guide rails 21 and 22 facing each other. The pair of conveyor belts are rotated in a state where each of both edges of the board K is placed on a conveyor conveyance surface, and carries in and out the board K at the mounting execution position which is set at a center portion of the frame 9. The backup unit 26 is disposed below the mounting execution position. The backup unit 26 pushes up the board K and clamps the board K in a horizontal posture to position the board K at the mounting execution position. Therefore, the component transfer device 4 performs a component mounting operation at the mounting execution position.

Multiple component supply devices 3 are provided and one of which is exchangeably equipped close to a rear side of the frame 9. The component supply device 3 is configured to include multiple feeder-type component supply units 8 (see FIG. 3 and hereinafter, abbreviated as feeder units 8). Details of the component supply device 3 will be described later.

The component transfer device 4 is an XY-robot type device capable of horizontally moving in the X-axis direction and the Y-axis direction. The component transfer device 4 is configured of a pair of Y-axis rails 41 and 42 configuring a head driving mechanism 48, a Y-axis slider 43, a mounting head 44, a nozzle tool 45, a suction nozzle 46, a board camera 47, and the like. The pair of Y-axis rails 41 and 42 are disposed close to side faces on both sides of the frame 9, and extended in a front-rear direction (Y-axis direction). The Y-axis slider 43 is movably mounted on the Y-axis rails 41 and 42. The Y-axis slider 43 is moved by a Y-axis ball screw mechanism (not illustrated) in the Y-axis direction.

The mounting head 44 is movably mounted on the Y-axis slider 43. The mounting head 44 is driven by an X-axis ball screw mechanism (not illustrated) in the X-axis direction. The nozzle tool 45 is exchangeably held in the mounting head 44. The nozzle tool 45 includes one or multiple suction nozzles 46 for sucking and picking up the component using a negative pressure. The suction nozzle 46 lifts and lowers to pick up the component from a component supply position 82 of the feeder unit 8 and mount the component on the board K. An upper face height of the board K which is positioned is set as a reference height H0 when the lifting and lowering operation of the suction nozzle 46 is controlled. Moreover, the nozzle tool 45 may include a mounting nozzle other than the suction nozzle 46 that uses the negative pressure.

The board camera 47 is provided on the mounting head 44 side by side with the nozzle tool 45. The board camera 47 images a position fiducial mark attached to the board K and detects an accurate position of the board K. In addition, the board camera 47 images an identification code attached to the feeder unit 8 and can specify an individual of the feeder unit 8. Furthermore, the board camera 47 can actually measure a height of the component supply position 82 by imaging a jig which is set in the component supply position 82 of the feeder unit 8.

The component camera 5 is provided upward on the upper face of the frame 9 between the board conveyance device 2 and the component supply device 3. The component camera 5 images a state of the component sucked by the suction nozzle 46 while the mounting head 44 moves from the component supply device 3 onto the board K. If deviation in a suction posture or a rotation angle of the component, or the like is determined by captured image data of the component camera 5, the control device 6 finely adjusts the component mounting operation as necessary and in a case where it is difficult to mount the component, a control is performed to discard the component.

The control device 6 is assembled to the frame 9 and an installation position of the control device 6 is not particularly limited. The control device 6 is a computer device having a CPU and operating with software. The control device 6 includes an input section 61 for input setting by an operator, a display section 63 that displays information to the operator, and a memory section 62 that memorizes various programs and data. As illustrated in FIG. 2, the control device 6 is communicatively connected to the board conveyance device 2, a device control section 38 of the component supply device 3, the component transfer device 4, and the component camera 5. Furthermore, the control device 6 is also communicatively connected to a higher-level host computer 7.

The control device 6 holds amounting sequence designating a kind and mounting order of the component to be mounted on the board K, the feeder unit 8 for supplying the component, or the like. The control device 6 controls the component mounting operation according to the mounting sequence based on captured image data of the board camera 47 and the component camera 5, detection data of a sensor (not illustrated), or the like. In addition, the control device 6 sequentially collects and updates operation condition data such as the production number of the boards K of which production is completed, a mounting time required for mounting the component, and the number of occurrences of the component suction error.

(2. Detailed Configuration of Component Supply Device 3)

Figure 3:
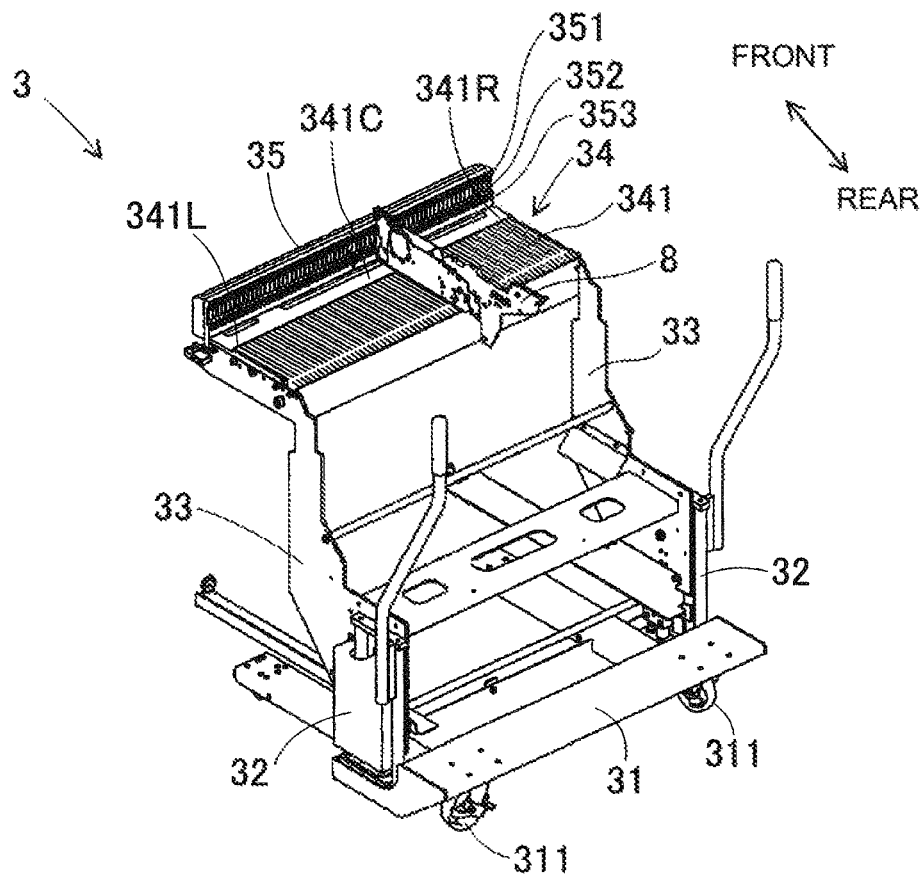
FIG. 3 is a perspective view viewed downward obliquely from an upper side of a rear left side of a component supply device.
Figure 4:
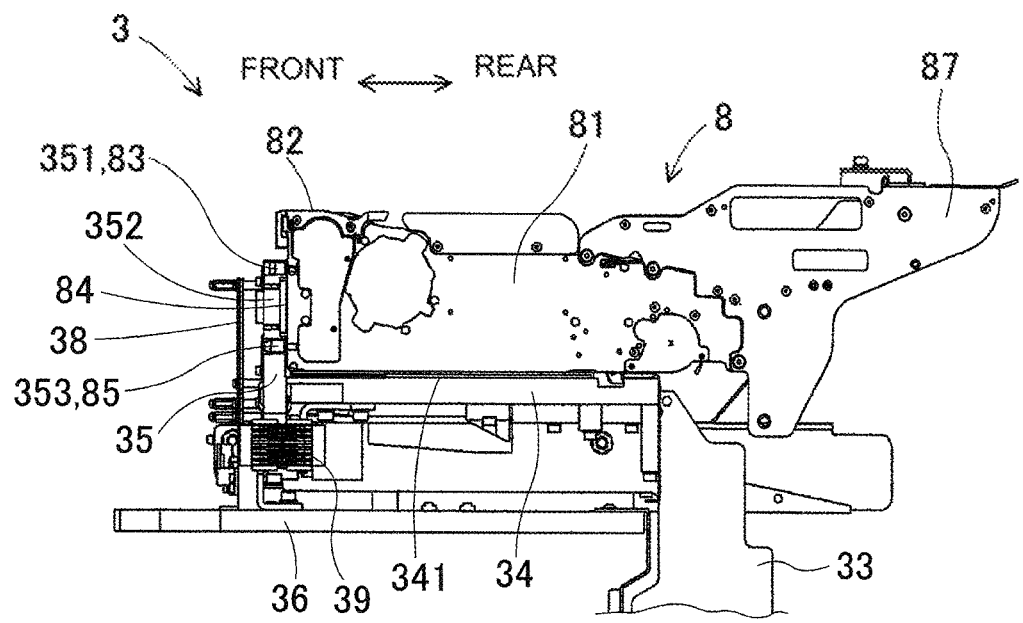
FIG. 4 is a side view of an upper portion of the component supply device.
Figure 5:
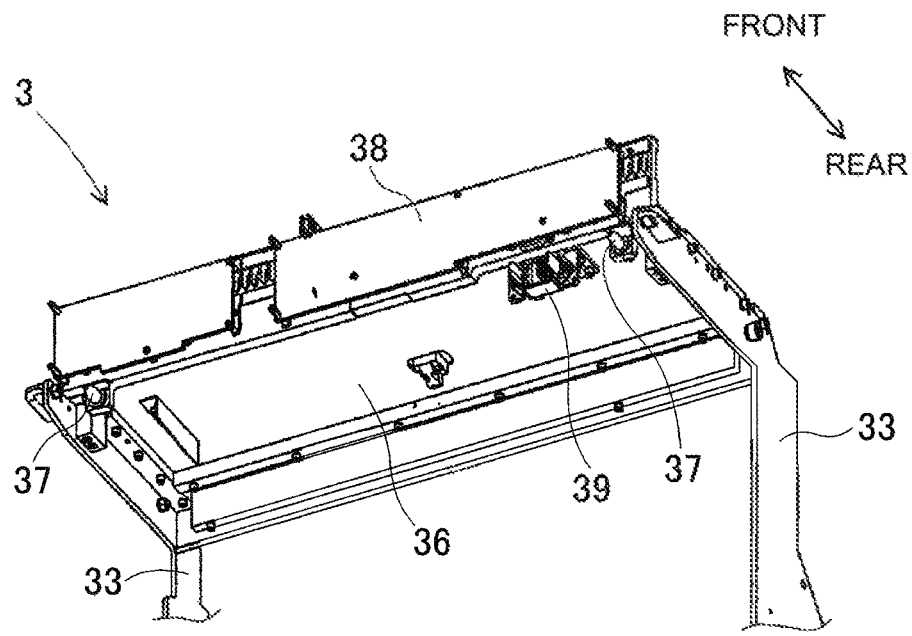
FIG. 5 is a perspective view illustrating a vicinity of an upper face of a placing plate of the component supply device.

Next, a detailed configuration of the component supply device 3 will be described. FIG. 3 is a perspective view viewed downward obliquely from an upper side of a rear left side of the component supply device 3. FIG. 4 is a side view of an upper portion of the component supply device 3. FIG. 5 is a perspective view illustrating a vicinity of an upper face of a placing plate 36 of the component supply device 3. In FIG. 3, only one feeder unit 8 is exemplified. During a normal use, a large number of the feeder units 8 are arranged in a width direction of the component supply device 3.

The feeder unit 8 has a flat shape with a small size in the width direction. The feeder unit 8 is configured of a main body section 81, a reel supporting section 87 that is disposed behind the main body section 81, a feeder control section 88 that is disposed on an inside of the main body section 81, and the like. As illustrated in FIG. 4, the component supply position 82 is set in the vicinity of a front end of an upper face of the main body section 81. An upper positioning pin 83, a feeder-side connector 84, and a lower positioning pin 85 are provided in this order from the top to the bottom of a front face of the main body section 81.

The main body section 81 has a tape feeding mechanism (not illustrated) for feeding out a carrier tape holding the component to the component supply position 82. The reel supporting section 87 rotatably supports a supply reel on which the carrier tape is wound. The tape feeding mechanism feeds out the carrier tape at a predetermined pitch in accordance with the control from the feeder control section 88. Therefore, the component is released from a stored state and is sequentially supplied from the component supply position 82 to the suction nozzle 46.

The component supply device 3 is configured of a wheeled table 31, a pallet member 34, a coupling member 35, the placing plate 36, the device control section 38, and the like. The wheeled table 31 is formed to be smaller than a width dimension of the component mounting machine 1 and multiple casters 311 for movement are provided on a lower side. Height adjustment sections 32 are respectively provided at side portions on both sides of the wheeled table 31. Arm members 33 are respectively erected to be adjustable in height from the height adjustment section 32 obliquely upward to the front side. The plate-like pallet member 34 is horizontally bridged across upper ends of tip portions of both arm members 33. The coupling member 35 is erected on a front side of the pallet member 34.

Slots 341 extending in the front-rear direction are formed side by side in the width direction in the pallet member 34. In the example of FIG. 3, 65 slots 341 are formed in the pallet member 34. An upper positioning hole 351, a device side connector 352, a lower positioning hole 353 are provided in this order from the top to the bottom at positions corresponding to each slot 341 of the coupling member 35.

Multiple feeder units 8 are respectively inserted and mounted from a rear to a front of the slot 341 of the pallet member 34. In this case, the upper positioning pin 83 and the lower positioning pin 85 are respectively fitted into the upper positioning hole 351 and the lower positioning hole 353. Therefore, each feeder unit 8 is positioned with respect to the pallet member 34 and the coupling member 35. In addition, the feeder-side connector 84 is fitted into the device side connector 352. Therefore, power is supplied to the feeder unit 8 and the feeder control section 88 and the device control section 38 are communicatively connected.

The plate-like placing plate 36 is horizontally bridged separated from a lower side of the pallet member 34 of a tip portion of the both arm members 33. As illustrated in FIG. 5, positioning pins 37 are erected obliquely upward to the front side at two right and left positions of the upper face of the placing plate 36. The device control section 38 in a form of a board is erected upward on the front side of the placing plate 36. A communication connector 39 which is connected to the device control section 38 is disposed between the placing plate 36 and the device control section 38.

After a height of the placing plate 36 is adjusted together with the arm member 33 by the height adjustment section 32, the placing plate 36 moves forward together with the wheeled table 31 and is placed on an upper face of the frame 9 on the rear side. In this case, the positioning pins 37 on the both sides are fitted into positioning holes provided on the frame 9 and positioning is performed. In addition, the device control section 38 is communicatively connected to the control device 6 via the communication connector 39. Therefore, the component supply device 3 is in an equipped state in the component mounting machine 1.

(3. Functions and Operations of Height Memory Section and Height Correction Control Section)

Figure 6:
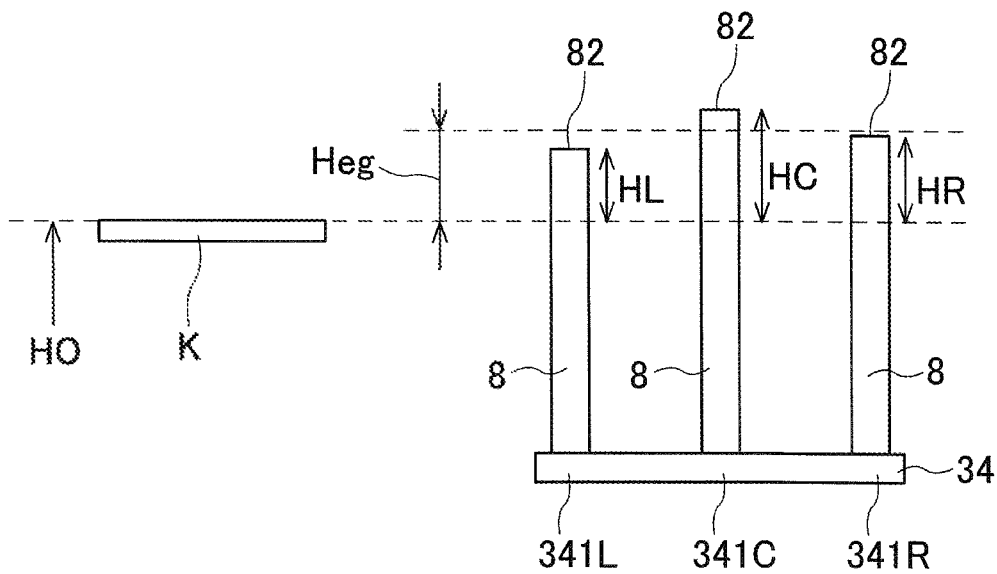
FIG. 6 is a view conceptually explaining a function of a height memory section by exaggerating a height direction.

Next, functions and operations of the height memory section and the height correction control section will be described. In the embodiment, the function of the height memory section is realized by the device control section 38 of the component supply device 3 and the function of the height correction control section is realized by the control device 6. FIG. 6 is a view conceptually explaining the function of the height memory section by exaggerating a height direction.

The device control section 38 expresses the height of the component supply position 82 of each feeder unit 8 when the component supply device 3 is equipped as a relative unit height to the reference height H0, and memorizes a height unique value Heg which is commonly set for each feeder unit 8 based on the unit height of each feeder unit 8. Here, considering a case where the feeder units 8 are mounted on all the slots 341 of the pallet member 34, the height of the component supply position 82 is data of a maximum of 65 points and it is cumbersome to actually measure all the data. Therefore, in the embodiment, three feeder units 8 are selected and the height of the component supply position 82 is actually measured. The selection positions of the three feeder units 8 are slots 341L, 341C, and 341R of a left end, a center, and a right end of 65 slots 341. The selection positions are not limited thereto and can be appropriately changed.

In addition, the component mounting machine 1 is often in operation and it is not always possible to actually measure the height of the component supply position 82 in a state where the component supply device 3 is equipped. Therefore, in the embodiment, the height of the component supply position 82 is actually measured in a state where the component supply device 3 is placed outside the component mounting machine 1. It is not limited thereto and the height of the component supply position 82 may be actually measured by the board camera 47 in a state where the component supply device 3 is equipped.

As illustrated in FIG. 6, three actually measured values of the height of the component supply position 82 which are obtained by the actual measurement are converted into relative unit heights HL, HC, and HR to the reference height H0. The device control section 38 calculates the height unique value Heg based on the three unit heights HL, HC, and HR. In the embodiment, as the height unique value Heg, an average value of the three unit heights HL, HC, and HR is used. It is not limited thereto and the height unique value Heg may be obtained by using another calculation method. For example, in a case where a margin is provided in the height direction in order to avoid a situation where the suction nozzle 46 collides with the component, it is preferable to set the height unique value Heg to a small value (low position). In this case, as the height unique value Heg, the minimum value of the three unit heights HL, HC, and HR can be used.

Moreover, instead of an actual product of the feeder unit 8, it is also possible to perform actual measurement by using a jig simulating the feeder unit 8. In the jig, the height of the component supply position 82 of the feeder unit 8, the attachment positions of the upper positioning pin 83 and the lower positioning pin 85, and the like are produced with high accuracy. Height errors of the upper positioning hole 351 and the lower positioning hole 353 corresponding to the selected slot 341 can be obtained with high accuracy by selecting some of the slots 341, mounting the jig on the slots 341, and measuring the height of the component supply position 82 of the jig. Furthermore, in actual measurement outside the machine using a jig, it is possible to use measuring instruments with higher accuracy than the board camera 47 in the machine. For example, it is possible to use a contact type sensor which detects the height of the component supply position 82 by lowering a detecting section and being in contact with the component supply position 82 of the jig.

The height unique value Heg which is finally obtained by being actually measured using the actual product of the feeder unit 8 or the jig is memorized in a non-volatile memory inside the device control section 38. When the component mounting machine 1 is equipped with the component supply device 3, the device control section 38 transmits the height unique value Heg to the control device 6 (height correction control section) which is communicatively connected thereto. Here, the component supply device 3 has individual differences in the shape of the positioning pins 37 on both sides and height positions where the positioning pins 37 are disposed. Therefore, the height unique value Heg is a unique value for each component supply device 3 and is a value capable of absorbing an influence of the individual differences of the component supply device 3.

In addition, 65 upper positioning holes 351 and 65 lower positioning holes 353 provided in the coupling member 35 do not perfectly coincide and contain errors. On the other hand, there are the individual differences also in the heights of the upper positioning pin 83 and the lower positioning pin 85 of the feeder unit 8. Furthermore, there are also individual differences in the height of the component supply position 82 due to the structure of the feeder unit 8. Therefore, the height unique value Heg is also a representative value capable of suppressing the influence of the individual differences of the multiple feeder units 8, the error in the attachment height, or the like.

The control device 6 corrects a lowering operation stroke amount when the suction nozzle 46 sucks the component from the component supply position 82 of each feeder unit 8 based on the height unique value Heg received from the device control section 38. According to this, when the component suction operation of the suction nozzle 46 is controlled, the influence of the individual differences of the multiple component supply devices 3 is absorbed and the influence of the individual differences and the error in the attachment height of the multiple feeder units 8, and the like are suppressed. A control section in the component transfer device 4 may receive information of the height unique value Heg and perform the correction of the lowering operation stroke amount.

Moreover, the height unique value Heg may be only one as the representative value, or may be plural. For example, the actually measured three unit heights HL, HC, and HR may be memorized as the height unique values. In this case, the 65 slots 341 are divided into a left group, a center group, and a right group, and the unit heights HL, HC, and HR are allocated in the vicinity of each group. The three unit heights HL, HC, and HR are selectively used according to the position of the slot 341 on which the feeder unit 8 is mounted and reflected in the control of the component suction operation of the suction nozzle 46. In addition, for example, heights of all the component supply positions 82 of the feeder units 8 to be mounted are actually measured and each actually measured value may be memorized as the height unique value.

(4. Mode and Effect of Component Mounting Machine 1 of Embodiment)

The component mounting machine 1 of the embodiment includes the frame 9; the multiple component supply devices 3 which respectively include the multiple feeder units 8 (component supply units) for supplying components at the component supply positions 82 and are exchangeably equipped on the frame 9; the component transfer device 4 which includes the suction nozzle 46 (mounting nozzle) performing the lifting and lowering operation and picking up the component from the feeder unit 8 to mount the component on the board K, which is equipped on the frame 9, and for which the reference height H0 as the reference of the lifting and lowering operation of the suction nozzle 46 is set; the device control section 38 (height memory section) which memorizes the height unique value Heg that is unique for each component supply device 3 and that is commonly set for each feeder unit 8 based on the unit heights HL, HC, and HR of each feeder unit 8, wherein the height of the component supply position 82 of each feeder unit 8 when the component supply device 3 is equipped is represented as the relative unit heights HL, HC, and HR to the reference height H0; and the control device 6 (height correction control section) which corrects the lowering operation stroke amount when the suction nozzle 46 picks up the component from each feeder unit 8 based on the height unique value Heg of the equipped component supply device 3.

Here, the height unique value Heg is the unique value for each component supply device 3 so that individual differences of the component supply device 3 which is exchanged and equipped can be absorbed, and the height unique value Heg is also the representative value that can suppress the influence of the individual differences and the error in the attachment height of the multiple feeder units 8, or the like. Therefore, an error in the height direction can be comprehensively absorbed and the component can be stably picked up by controlling the component pick-up operation of the suction nozzle 46 based on the height unique value Heg.

Furthermore, the device control section 38 is provided in the component supply device 3 and transmits the height unique value Heg to the control device 6 when the component supply device 3 is equipped. Therefore, if the height unique value Heg of each component supply device 3 is measured and memorized once, the height unique value Heg is automatically transmitted to the control device 6 whenever the component supply device 3 is equipped. Therefore, it is possible to reduce the labor of setup changing work when the component supply device 3 is exchanged and equipped.

Furthermore, in a state where the component supply device 3 is placed outside the machine, the actually measured value of the unit height of a part of the multiple feeder units 8 is obtained and the height unique value Heg is calculated based on the actually measured value. According to this, even in a state where the component mounting machine 1 is operated, it is possible to obtain the height unique value Heg outside the machine in advance. Therefore, the setup changing work is made more efficient and the operation of the component mounting machine 1 is not hindered.

Furthermore, the component supply device 3 includes the multiple feeder units 8 arranged in the width direction. According to this, the height unique value Heg is the representative value capable of suppressing the influence of the individual differences and the error in the attachment heights of the multiple feeder units 8, and the like. Therefore, the component can be stably picked up from the multiple feeder units 8 by controlling the component suction operation of the suction nozzle 46 based on the height unique value Heg.

(5. Component Mounting Line 100 of Embodiment)

Figure 7:
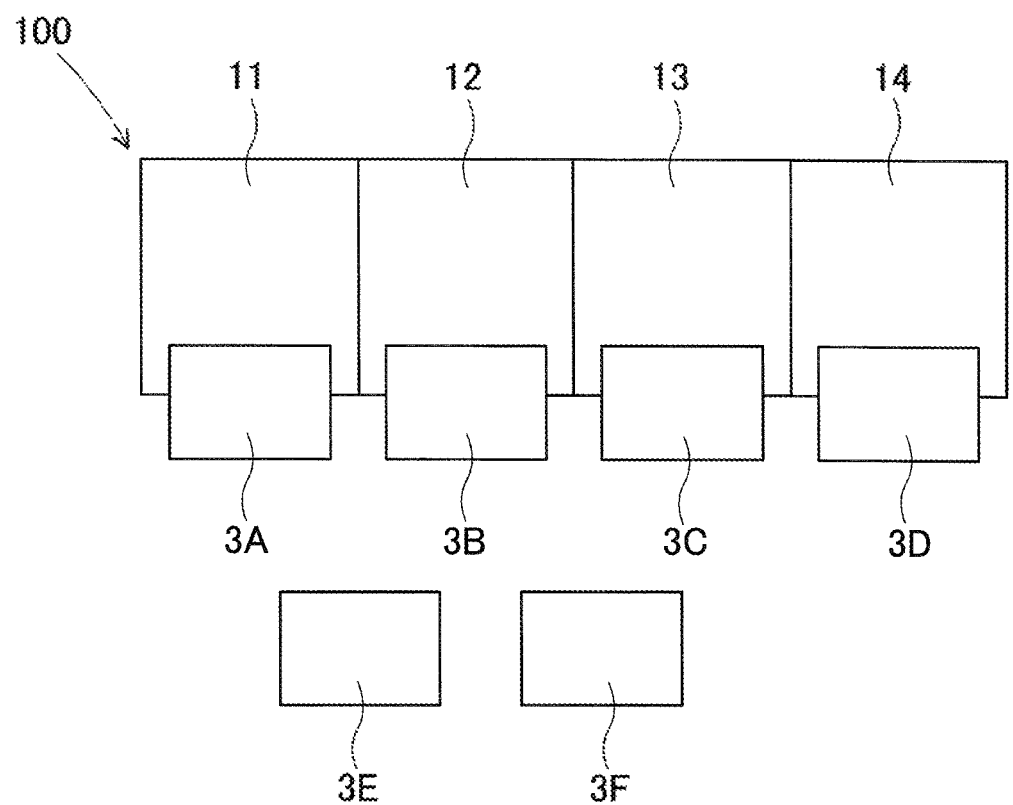
FIG. 7 is a plan view illustrating a configuration of a component mounting line of an embodiment.

Next, a component mounting line 100 of the embodiment of the disclosure will be described mainly in terms of not being described in the component mounting machine 1 of the embodiment and differences from the component mounting machine 1 of the embodiment. FIG. 7 is a plan view illustrating a configuration of the component mounting line 100 of the embodiment. The component mounting line 100 of the embodiment is configured by connecting four component mounting machines 11 to 14 having the same structure as the component mounting machine 1 of the embodiment in a line. The four component mounting machines 11 to 14 can be exchangeably equipped with six component supply devices 3A to 3F having the same structure as the already described component supply device 3. In the example of FIG. 7, the first to fourth component mounting machines 11 to 14 are equipped with the first to fourth component supply devices 3A to 3D, and the fifth and sixth component supply devices 3E and 3F are prepared for exchange.

In the component mounting line 100 of the embodiment, a function of a height memory section and a function of a height correction control section are realized by a control device 6 of each of the component mounting machines 11 to 14. In addition, selection positions of three feeder units 8 actually measuring a unit height when obtaining a height unique value Heg are slots 341L, 341C, and 341R of a left end, a center, and a right end. However, the actual measurement of the unit height is performed in a state where the component mounting machines 11 to 14 are equipped with the component supply devices 3A to 3F.

That is, when the new component supply devices 3A to 3F and the component supply devices 3A to 3F after maintenance is performed are first equipped on the component mounting machines 11 to 14, the control device 6 executes a program for calculating the height unique value Heg. Prior to execution of the program, an operator sets jigs respectively at component supply positions 82 of a feeder unit 8 mounted on the slots 341L, 341C, and 341R of the left end, the center, and the right end. Next, the control device 6 actually measures heights of three component supply positions 82 by sequentially moving a board camera 47 above three jigs to image each jig.

Next, the control device 6 converts the actually measured values of the heights of the three component supply positions 82 into the unit height. Furthermore, the control device 6 calculates the height unique value Heg according to a calculation method such as a preset average value calculation or minimum value selection. Finally, the control device 6 memorizes an identification code for identifying individuals of the component supply devices 3A to 3F and the height unique value Heg of the component supply devices 3A to 3F as a set. In the second and subsequent equipment of the component supply devices 3A to 3F, the memorized height unique value Heg is used without actually measuring the unit height and performing the calculation of the height unique value Heg.

Here, it is permitted that the height unique values Heg of each of the component supply devices 3A to 3F are different from each other in the four component mounting machines 11 to 14. For example, a height unique value HA of the first component supply device 3A is memorized as a height unique value HA1 in the first component mounting machine 11, a height unique value HA2 in the second component mounting machine 12, a height unique value HA3 in the third component mounting machine 13, and a height unique value HA4 in the fourth component mounting machine 14. It is permitted that HA1≠HA2≠HA3≠HA4.

Similarly, the height unique value HB of the second component supply device 3B is memorized as height unique values HB1, HB2, HB3, and HB4 respectively in the four component mounting machines 11 to 14, and the four height unique values HB1, HB2, HB3, and HB4 may be different from each other. Furthermore, similarly, the height unique values Heg of the third to sixth component supply devices 3C to 3F are permitted to be different from each other in the four component mounting machines 11 to 14.

The reason why the height unique values Heg (HA1 to HA4 and HB1 to HB4) differ among the four component mounting machines 11 to 14 is caused by the individual differences on the side of the component mounting machines 11 to 14. For example, a height of a positioning hole on the side of the frame 9 into which the positioning pin 37 of the component supply device 3 is fitted can be different in the four component mounting machines 11 to 14 (individual differences may occur). In this case, even if the same component supply device (any one of 3A to 3F) is equipped, a placing height of the placing plate 36 varies among the four component mounting machines 11 to 14 so that a difference in the height unique value Heg occurs.

In each of the component mounting machines 11 to 14 configuring the component mounting line 100 of the embodiment, an error in the height direction can be comprehensively absorbed and the component can be stably picked up by controlling a component pick-up operation of the suction nozzle 46 based on the memorized height unique value Heg.

Furthermore, the control device 6 (height correction control section) of each of the component mounting machines 11 to 14 also serves as a height memory section and memorizes the identification code for identifying the individual of the component supply device 3 and the height unique value Heg of the component supply device 3 as a set. According to this, if the height unique value Heg of each of the component supply devices 3A to 3F is measured and memorized once, the height unique value Heg is automatically reflected on the component suction operation corresponding to the equipped component supply device 3. Therefore, it is possible to reduce the labor of setup changing work when the component supply device 3 is exchanged and equipped.

Furthermore, in each of the component mounting machines 11 to 14, in a state where the component supply devices 3A to 3F are equipped, the actually measured value of the unit height of a part of multiple feeder units 8 is obtained and the height unique value Heg is calculated based on the actually measured value. According to this, the height unique value Heg is obtained under the actual use situation in which the component supply devices 3A to 3F are equipped on the component mounting machines 11 to 14, so that the accuracy of the height unique value Heg is improved.

In addition, the component mounting line 100 of the embodiment includes multiple component mounting machines 11 to 14 having the same structure as the component mounting machine 1 of the embodiment, multiple component supply devices 3A to 3F are exchangeably equipped on each of the component mounting machines 11 to 14, and it is permitted that the height unique values Heg (HA1 to HA4 and HB1 to HB4) are different from each other in the multiple component mounting machines 11 to 14. According to this, since the height unique values Heg reflecting the individual differences on the side of the component mounting machines 11 to 14 are individually obtained, the accuracy of the height unique value Heg in each of the component mounting machines 11 to 14 is further improved.

(6. Application and Modification of Embodiment)

As described above, there is no need to calculate the height unique value Heg whenever the component supply devices 3, 3A to 3F are equipped. Nevertheless, with respect to the component supply devices 3, 3A to 3F after a number of the feeder units 8 are exchanged, it is preferable to find the height unique value Heg by actually measuring the unit height in a state where the component supply devices 3, 3A to 3F are equipped or in a state where the component supply devices 3, 3A to 3F are placed outside the machine.

In addition, the positioning structure of the feeder unit 8 using the upper and lower positioning pins 83 and 85, and the positioning structure of the component supply device 3 using the positioning pin 37 on the upper face of the placing plate 36 may be other structures. Regardless of the positioning structure, according to the disclosure, it is possible to comprehensively and finally absorb the error in the height of the component supply position 82. Furthermore, in the embodiment, the component supply device 3 is configured to include the multiple feeder units 8, but the disclosure is not limited to the embodiment. For example, the component supply device 3 may be configured by multiple tray type component supply units.

Furthermore, the lowering operation stroke amount of the suction nozzle 46 may be corrected by using data of the individual differences of the feeder unit 8. For example, the feeder unit 8 can store data on its own dimension in a memory inside the feeder control section 88. Then, the control device 6 can receive the height unique value Heg from the device control section 38 and can receive data relating to the dimension of the feeder unit 8 from the feeder control section 88 via the device control section 38. According to this, the control device 6 can accurately correct the lowering operation stroke amount individually in consideration of the dimensions of each feeder unit 8. In addition, the height memory section and the height correction control section of the disclosure may be realized by a control section and a computer other than the device control section 38 and the control device 6. Various other applications and modifications are possible with the disclosure.

REFERENCE SIGNS LIST 1, 11 to 14: component mounting machine, 2: board conveyance device, 3, 3A to 3F: component supply device, 34: pallet member, 341, 341L, 341C, 341R: slot, 38: device control section (height memory section), 4: component transfer device, 46: suction nozzle, 5: component camera, 6: control device (height correction control section, height memory section), 8: feeder-type component supply unit (feeder unit), 82: component supply position, 9: frame, 100: component mounting line, H0: reference height, Heg: height unique value, HL, HC, HR: unit height

The invention claimed is:

1. A component mounting machine comprising:

a frame;

a plurality of component supply devices which respectively include a plurality of component supply units each configured to supply components at component supply positions and the plurality of component supply devices are exchangeably equipped on the frame;

a component transfer device which includes a mounting nozzle, the mounting nozzle configured to perform a lifting and lowering operation and pick up components from the component supply units of the component supply device which is equipped on the frame to mount the components on a board equipped on the frame, and a reference height as a reference of the lifting and lowering operation of the mounting nozzle is set;

a height memory section which memorizes a height unique value that is unique for each of the component supply devices, the height unique value being and commonly set for each component supply unit of each of the component supply devices based on the plural unit heights of the component supply units of the component supply device, wherein the unit heights of the component supply units is represented as a relative unit height of the component supply position of each component supply unit when the component supply device is equipped on the frame with respect to the reference height; and a height correction control section which corrects a lowering operation stroke amount when the mounting nozzle picks up the components from the component supply units of the component supply device which is equipped on the frame based on the height unique value of the equipped component supply device memorized by the height memory section.

2. The component mounting machine according to claim 1,
wherein the height memory section is provided in each of the component supply devices and transmits the height unique value of the component supply device to the height correction control section when the component supply device is equipped on the frame.

3. The component mounting machine according to claim 1,
wherein the height correction control section serves as the height memory section and sets and memorizes an identification code for identifying an individual of the component supply devices and the height unique value of the individual component supply device.

4. The component mounting machine according to claim 1,
wherein in a state where the component supply device is equipped or is placed outside the machine, an actually measured value of the unit height of a part or all of the plurality of the component supply units is obtained and the height unique value is calculated based on the actually measured value.

5. The component mounting machine according to claim 1,
wherein the component supply units of the component supply devices include feeder-type component supply units arranged in a width direction.

6. A component mounting line comprising:
a plurality of the component mounting machines according to claim 1,
wherein at least a part of the plurality of the component supply devices is exchangeably equipped on at least a part of the plurality of the component mounting machines and the height unique values differ from each other in at least a part of the plurality of the component mounting machines.

* * * * *